United States Patent [19]
Hiroe et al.

[11] Patent Number: 5,593,774
[45] Date of Patent: Jan. 14, 1997

[54] INSULATING FILM WITH IMPROVED PUNCHING CHARACTERISTICS AND LEAD FRAME USING THE SAME

[75] Inventors: Toshikatsu Hiroe; Kenichi Kaneko; Noboru Imai; Hiroyuki Takasaka; Toshio Kawamura, all of Ibaraki, Japan

[73] Assignee: Hitachi Cable, Ltd., Tokyo, Japan

[21] Appl. No.: 586,478

[22] Filed: Jan. 16, 1996

Related U.S. Application Data

[63] Continuation of Ser. No. 249,734, May 26, 1994, abandoned.

[30] Foreign Application Priority Data

May 26, 1993 [JP] Japan ................................. 5-146989

[51] Int. Cl.[6] ........................................................ B32B 9/00
[52] U.S. Cl. ...................... 428/343; 428/344; 428/473.5; 428/209
[58] Field of Search ................................ 428/343, 355, 428/344, 473.5, 209, 901

[56] References Cited

U.S. PATENT DOCUMENTS

| | | |
|---|---|---|
| 4,862,245 | 8/1989 | Pashby et al. . |
| 5,102,722 | 4/1992 | Iida ........................................ 428/215 |
| 5,277,972 | 1/1994 | Sakumoto ............................. 428/355 |

Primary Examiner—Patrick Ryan
Assistant Examiner—Patrick Jewik
Attorney, Agent, or Firm—Helfgott & Karas, P.C.

[57] ABSTRACT

The occurrence of burrs and chips in punching an insulating film is suppressed by adjusting an edge tearing resistance of the insulating film. The edge tearing resistance is preferably 50 to 70 kgf/20 mm for the purpose of suppressing the burrs and the chips.

3 Claims, 8 Drawing Sheets

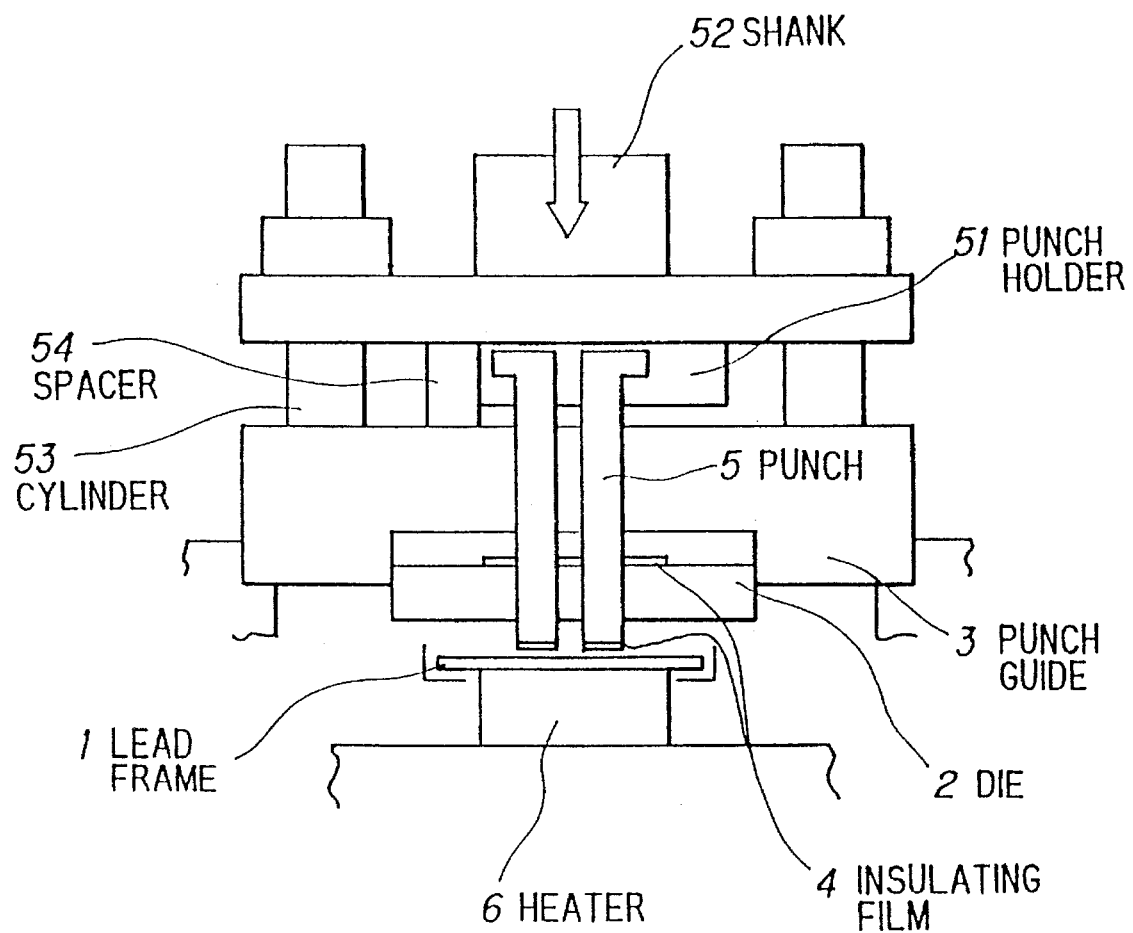

FIG. 3C
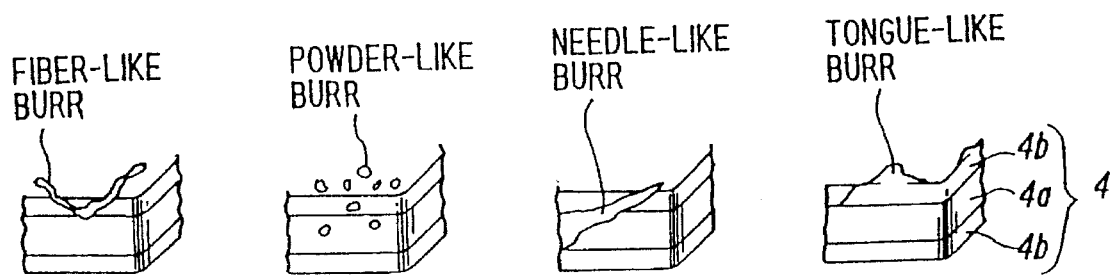
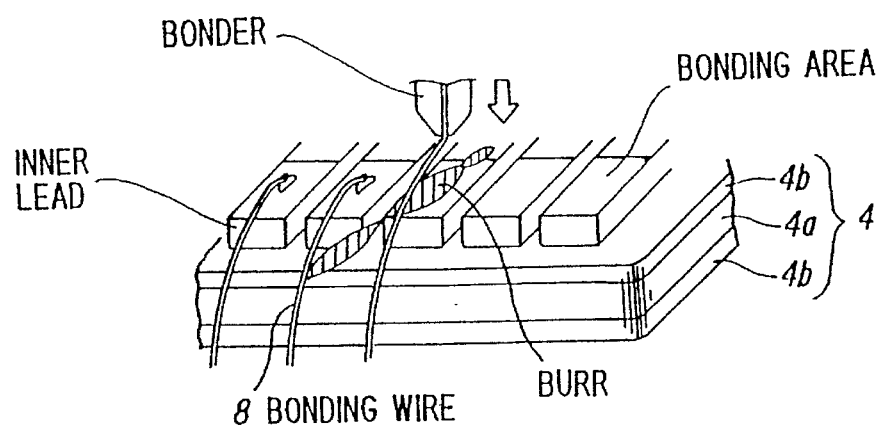

INSULATING FILM WITH IMPROVED PUNCHING CHARACTERISTICS AND LEAD FRAME USING THE SAME

This is a continuation of application Ser. No. 08/249,734, filed May 26, 1994, now abandoned.

FIELD OF THE INVENTION

The invention relates to an insulating film with improved characteristics, and a lead frame using the same, and more particularly, to an insulating film to be punched by suppressing the occurrence of burrs and chips, and a lead frame using the same.

BACKGROUND OF THE INVENTION

So-called pre-fabrication lead frames have been proposed to realize high density mounting of semiconductor chips in the form of COL (Chip on Lead), LOC (Lead on Chip), etc. This kind of a lead frame is provided with an insulating film punched to a predetermined configuration and adhesively fixed on an inner lead portion of the frame, wherein the insulation film is composed of a polyimide-based film having a high heat-proof property and thermoplastic or thermosetting adhesive layers on both surfaces (or one surface) of the polyimide-based film.

In providing the insulating film, an apparatus comprising punches and a die is used to punch an insulating film placed on the die by lowering the punches, wherein a clearance between each of the punches and the die is adjusted to suppress the occurrence of chips at the time of punching the insulating film and burrs at edges of a punched insulating film.

In the conventional insulating film to be used for the COL lead frame, the LOG lead frame, etc., however, there is a disadvantage in that the occurrence of chips and burrs can not be suppressed sufficiently, even if a clearance between a punch and a die is adjusted, because mechanical characteristics of an insulating film to be punched are varied, especially, in regard to an edge tearing resistance. Consequently, the dimensional precision of the punched insulating film is lowered by concealing an area for bonding wires on the lead frame by burrs and chips. This means that it is impossible for bonding wires to be bonded between the lead frame and a semiconductor chip mounted thereon.

There are further disadvantages in the conventional insulating film in that burrs and chips tend to be accumulated between the punch and the die, so that the positional precision of fixing a punched insulating film on a lead frame is lowered, and marks of burrs and chips are impressed on a punched insulating film to be thereby classified into a faulty. This means that cleaning of the punch and die must be done often.

SUMMARY OF THE INVENTION

Accordingly, it is an object of the invention to provide an insulating film with improved punching characteristics and a lead frame using the same in which the occurrence of burrs and chips are effectively suppressed.

It is a further object of the invention, to provide an insulating film with improved punching characteristics and a lead frame using the same in which a high dimensional precision is obtained, and no accumulation of burrs and chips is found on a punch and a die in a punching apparatus.

According to a feature of the invention, an insulating film with improved punching characteristics, comprises:

an insulating base film having an edge tearing resistance of 50 to 70 kgf/20 mm; and insulating thermoplastic or thermosetting adhesive layers provided on at least one surface of the insulating base film.

According to another feature of the invention, a lead frame using an insulating film with improved punching characteristics, comprises:

inner lead portions to be connected to a semiconductor chip;

outer lead portions to be connected to external circuits; and insulating films punched to being a predetermined configuration, the punched films adhesively fixed to the inner lead portions;

wherein the punched films comprise insulating base films having an edge tearing resistance of 50 to 70 kgf/20 mm.

BRIEF DESCRIPTION OF THE DRAWINGS

The invention will be explained in more detail in conjunction with appended drawings, wherein:

FIG. 1 is an explanatory view showing a conventional apparatus for fixing an insulating film to a lead frame.

DESCRIPTION OF THE PREFERRED EMBODIMENTS

Figure 2A:
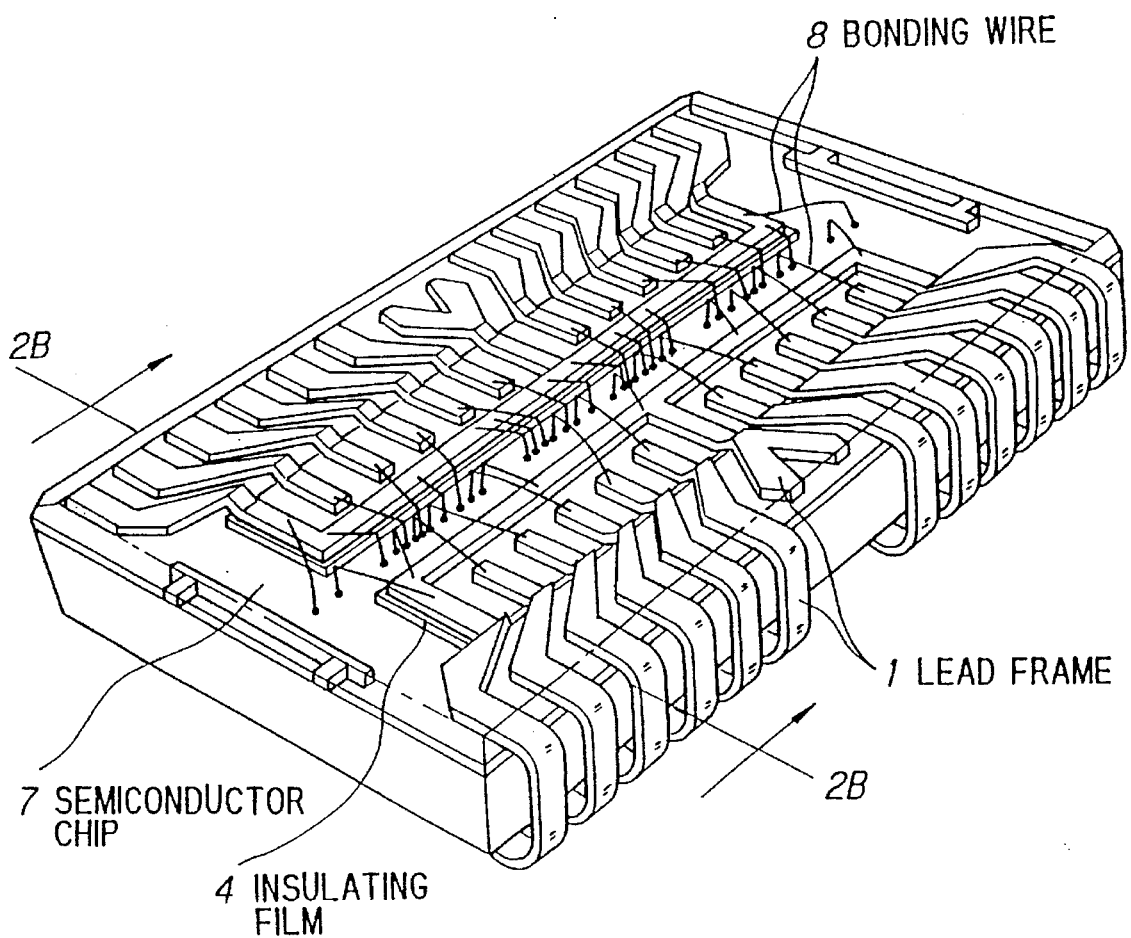
FIG. 2A is a perspective view showing a semiconductor chip package.

Before explaining an insulating film with improved punching characteristics and a lead frame using the same in the preferred embodiments according to the invention, a conventional apparatus for fixing an insulating film to a lead frame will be explained.

FIG. 1 shows the conventional apparatus for fixing an insulating film to a lead frame. The apparatus comprises a die 2 for placing an insulating film 4 thereon, punches 5 for punching the insulating film 4 and retaining the punched insulating films 4 on the tip plane by vacuum, a punch guide 3 for guiding the punches 5 through guide apertures thereof, a heater 6 for heating a lead frame 1 placed thereon to be a predetermined temperature, a punch holder 51 for holding the punches 5, a shank 52 for vertically moving the punches 5 up and down, and a cylinder 53 for generating a moving force to be applied to the shank 52. In some use, a spacer 54 may be provided.

In operation, the insulating film 4 is transferred on the die 2 by an transfer apparatus (not shown), when the punches 5 take an upper position. At the same time, the lead frame 1 is also transferred to a predetermined position on the heater 6. Then, the punches 5 are moved down to punch the insulating film 4, so that the punched insulating films 4 are retained on the tip plane of the punches 5 by vacuum, and are lowered to be pressed on the heated lead frame 1 on the heater 6. Thus, a lead frame 1, which is fixed with the punched insulating films 4, is obtained. Then, the insulating film-fixed lead frame 1 is processed to be adhesively attached to a semiconductor chip for fabricating a semiconductor chip package.

Figure 2B:
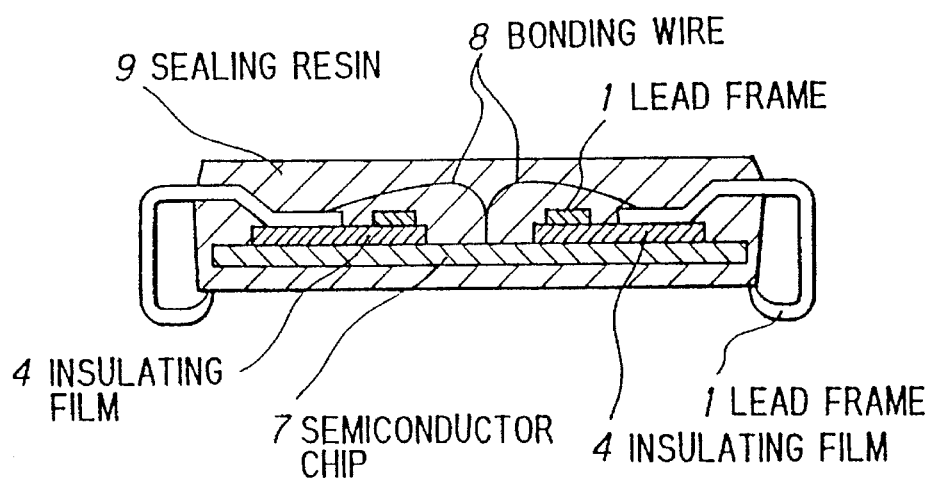
FIG. 2B is a cross-sectional view cut along the line 2B—2B in FIG. 2A, FIGS. 3A and 3B are explanatory diagrams explaining mechanism for the occurrence of punching burrs and punching chip in a conventional apparatus for fixing an insulating film to a lead frame.

FIGS. 2A and 2B show the semiconductor chip package thus fabricated. The semiconductor chip package comprises a semiconductor chip 7 having electrodes thereon, and a lead frame 1 fixed with punched insulating films 4, wherein the lead frame 1 is adhesively attached to the semiconductor chip 7 by the fixed insulating films 4, and a inner lead portion of the lead frame 1 is bonded to the electrodes by bonding wires 8, such that a whole structure of the semiconductor chip 7 is sealed to expose only an outer lead portion of the lead frame 1 by molding resin 9 (not shown in FIG. 2A, but shown in FIG. 2B). In the semiconductor chip package, the punched insulating films 4 are, for instance, polyimide films, are layered on the both surfaces with thermoplastic or thermosetting adhesives to provide heat-proof characteristics of 250° to 400° C. As understood from the illustration in FIGS. 2A and 2B, the precision in positioning of the lead frame 1 on the semiconductor chip 7 must be high, because the inner leads must be precisely and stably bonded to the electrodes by the bonding wires 8.

Figure 3A:
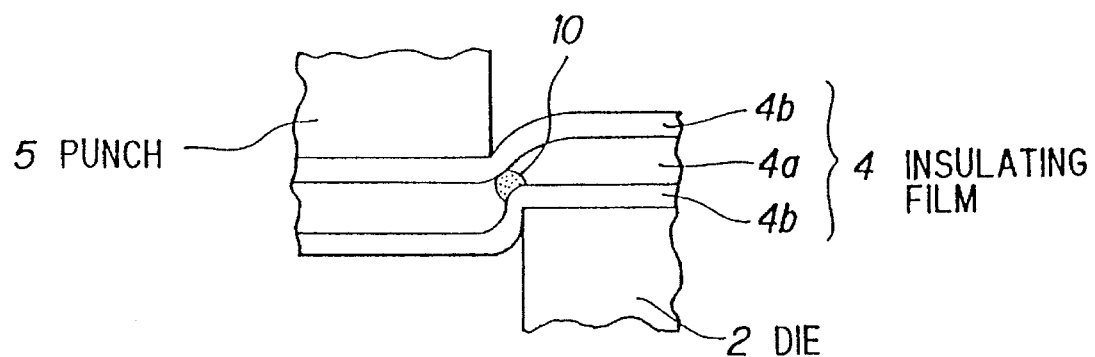
FIG. 3C is an explanatory diagram explaining the punching burrs as explained in FIGS. 3A and 3B.

FIG. 3A shows an operation in which an insulating film 4, composed of a polyimide film 4a and adhesive layers 4b, is pressed to cause a compressive breakage point 10 in the polyimide film 4a by a punch 5 and a die 2, while substantially no deformation is found in the adhesive layers 4b, so that punching chips and punching burrs are generated in accordance with the compressive breakage point 10.

Figure 3B:
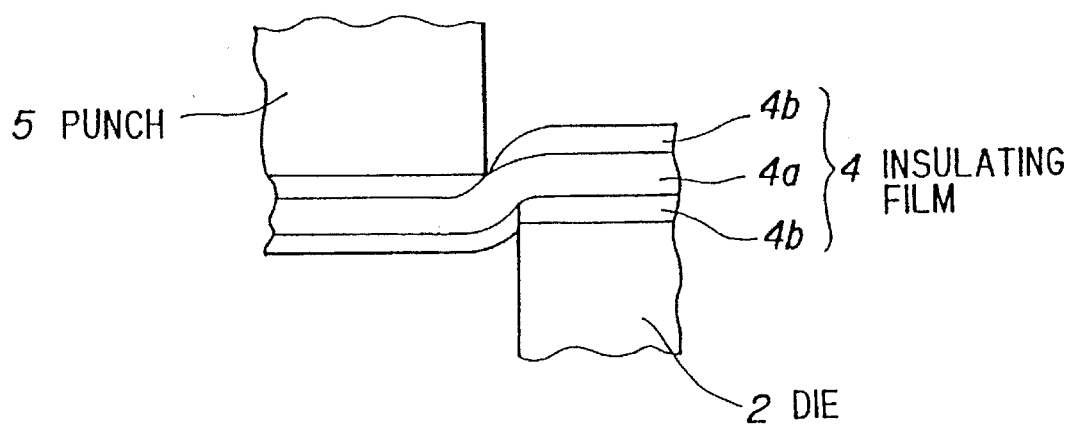

FIG. 3B shows operation in which the adhesive layers 4b of the insulating film 4 is first punched, and the polyimide film 4a of the insulating film 4 is then punched, so that no compressive breakage point is found in the polyimide film 4a. Consequently, burr and chip are not generated substantially.

The inventors have confirmed in experiments whether an insulating film 4 is punched in operation as shown in FIG. 3A or FIG. 3B is determined by mechanical characteristics of the insulating film 4, among which an edge tearing resistance of the insulating film 4 is a very important factor to suppress the occurrence of punching burrs and punching chips.

FIG. 3C shows four kinds of punching burrs, wherein the burr interrupts the bonding wire 8 to be bonded to an inner lead of the lead frame 1.

Polyimide films now available for this purpose are listed to indicate mechanical characteristics in the Table 1.

TABLE 1

|  | UPILEX-S | UPILEX-R | UPILEX-M | KAPTON-V | KAPTON-H |
| --- | --- | --- | --- | --- | --- |
| TENSILE STRENGTH (kgf/mm$^2$) | 40 | 25 | 40 | 30 | 25 |
| ELONGATION (%) | 30 | 130 | 60 | 86 | 80 |
| TENSILE ELASTIC MODULUS (kgf/mm$^2$) | 900 | 380 | 550 | 352 | 302 |
| TEARING STRENGTH (kgf/mm$^2$) | 330 | 750 | 500–580 | — | — |
| EDGE TEARING RESISTANCE (kgf/20 mm) | 23 | 40 | — | — | — |
| THERMAL EXPANSION COEFFICIENT (PPM) | 10 | 32 | 10–25 | — | — |

As understood from the table 1, the mechanical characteristics of the polyimide films range widely. Therefore, punching burrs and punching chips tend to occur dependent on the deviation from a desired range of the mechanical characteristics.

Next, an insulating film 4 with improved punching characteristics and a lead frame using the same in the preferred embodiment will be explained.

Figure 4:
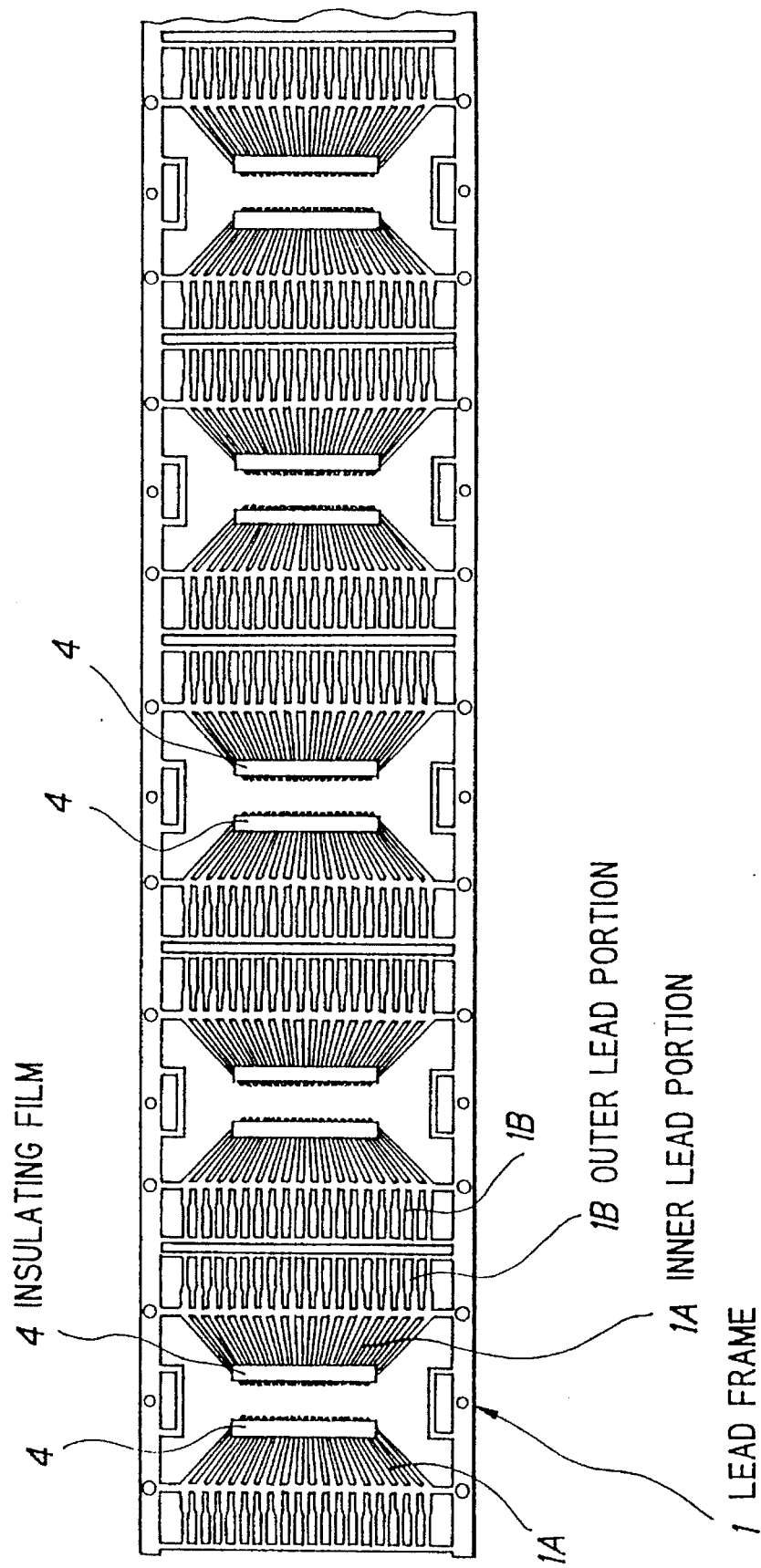
FIG. 4 is a plan view showing a lead frame using an insulating film in an experiment according to the invention.

FIG. 4 shows the lead frame 1 having inner lead portions 1A and outer lead portions 1B, and the insulating films 4 adhesively attached to the inner lead portions 1A of the lead frame 1.

In experiments conducted by the inventors, 30 pieces of insulating films 4 are prepared and adhesively attached on the lead frame 1 as shown in FIG. 4. Each piece has two punched insulating films 4, and is divided into plural groups, each of which is different in edge tearing resistance from other groups.

Such insulating films are fabricated by the steps as set out below.

First, solvent is added to a starting material such as polyamide acid, etc. to provide varnish. Next, the varnish is coated on a metal mold, a roller, etc., and then heated to be dry. Then, the dried film is peeled from the surface of the metal mold, the roller, etc. to provide polyimide-based films. Then, polyimide-based films having adhesive layers are obtained by coating thermosetting or thermoplastic adhesive on both surfaces or one surface of the polyimide-based films.

In insulating films with adhesive layers thus fabricated, the edge tearing resistance is changed by adjusting a water component.

For this purpose, a solvent having a water absorbing property is used. Thus, the edge tearing resistance is made to a predetermined value by the non-volatile amount of the solvent, which is controlled at the heating and dry step.

The measurement of the edge tearing resistance is specified in the JIS C2318 6.3.4.

In this standard, five test pieces each having a width of 20 mm and a length of 200 mm are sampled without any concentration on a specific area in longitudinal and transversal directions whole length and width of a film to be measured. Each test piece is passed through an aperture of a stationary testing device, and then folded to face each at the both ends. Then, the folded ends of the test piece are chucked to be pulled in a direction at the speed of 200 mm per one minute by a tensile member. Then, a mean value and a minimum value of pulling forces by which the test piece is teared are measured as the edge tearing resistance.

Referring back to FIG. 4, the 30 pieces of the insulating films 4 are punched to be adhesively fixed to the inner lead portions 1A of the lead frame 1, wherein each piece consist of two insulating films 4, classified into the several groups of different edge tearing resistances, as explained before.

Figure 5:
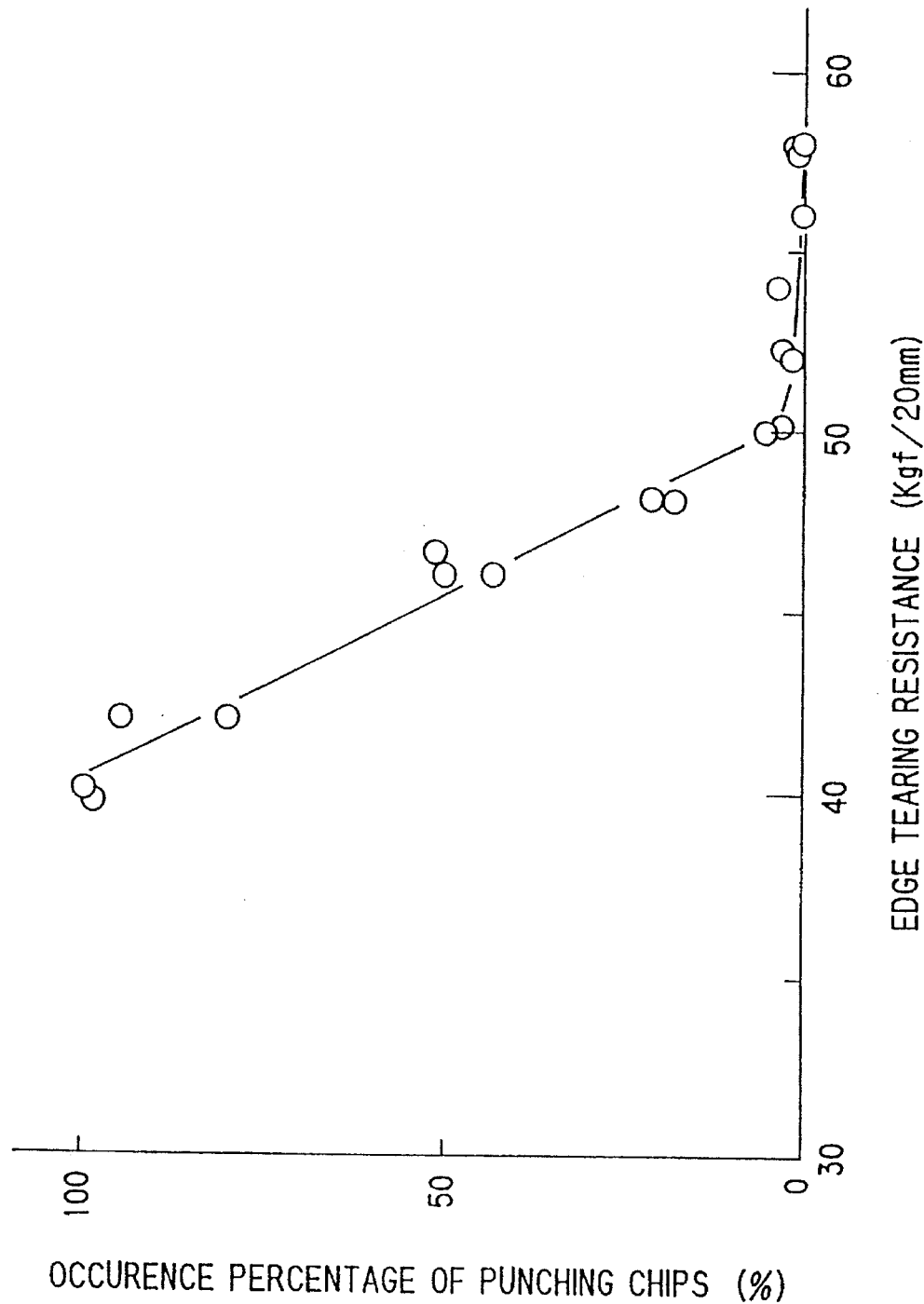
FIG. 5 is a graph showing the test results in the experiment.

In obtaining the punched insulating films 4, the occurrence percentage % of punching chips is measured as indicated in FIG. 5, wherein a piece of two insulating films 4 is determined to have generated punching chips, when the punching chips are found in at least one of the two insulating films 4 for the piece.

As understood in FIG. 5, the occurrence percentage % is decreased, as the edge tearing resistance of the insulating films 4 is increased. To be more concrete, when a polyimide-based film having an edge tearing resistance equal to or greater than 50 kgf/20 mm is used, the occurrence percentage % is approximately 0%. In this respect, the maximum edge tearing resistance is limited to be approximately 70 kgf/20 mm, because it is difficult to fabricate an insulating film composed of a great amount of residual solvent by heating varnish films coated on molds, rollers, etc. As explained before, the amount of the residual (non-volatile) solvent is reduced, the water or moisture absorption property of an insulating film is lowered to provide a small edge tearing resistance. In accordance with the inventor's experiment, it is confirmed that an edge tearing resistance of the insulating films 4 is preferable to be in a range of 50 to 70 kgf/20 mm.

Figure 6:
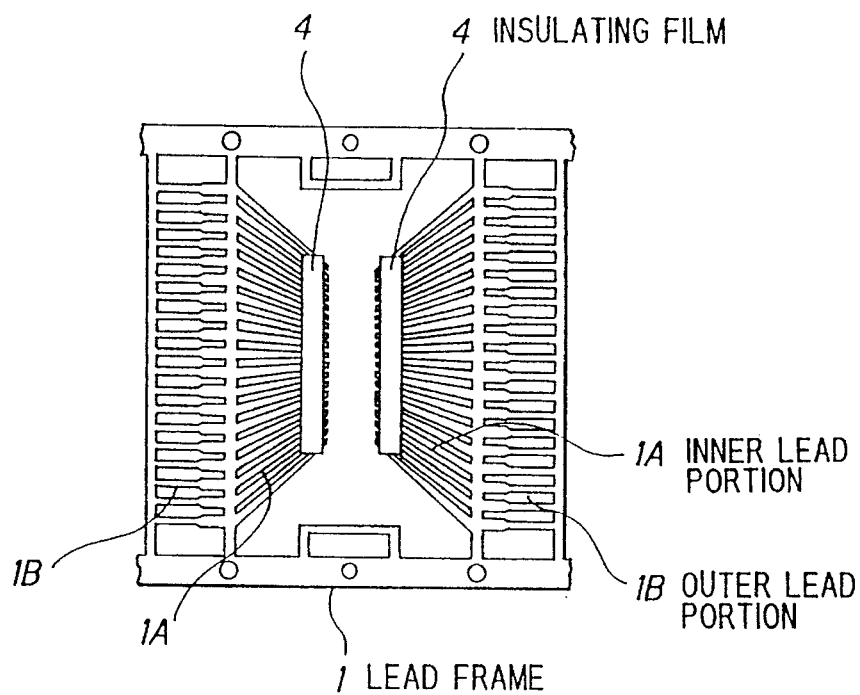
FIG. 6 is a plan view showing a lead frame using an insulating film in a preferred embodiment according to the invention.

FIG. 6 shows a lead frame 1 having inner lead portions 1A and outer lead portions 1B of a LOC structure, and insulating films 4 of polyimide-based films adhesively fixed to the inner lead portions 1A, wherein a semiconductor chip (not shown) is adhesively mounted on the inner lead portions 1A of the lead frame 1 by the insulating films 4. In this preferred embodiment, the insulating films 4 have an edge tearing resistance of 50 to 70 kgf/20 mm.

Figure 7A:
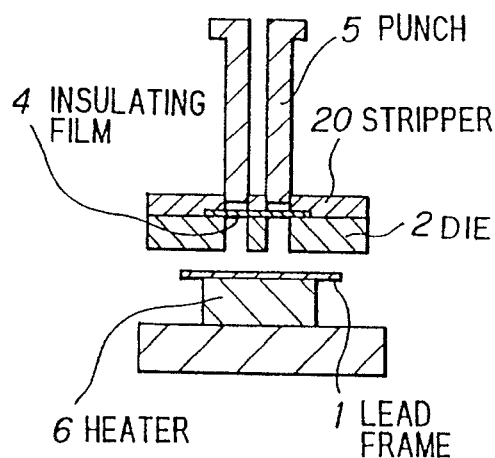
FIGS. 7A and 7B are cross-sectional view showing a punch and a die for punching an insulating film in the preferred embodiment.
Figure 7B:
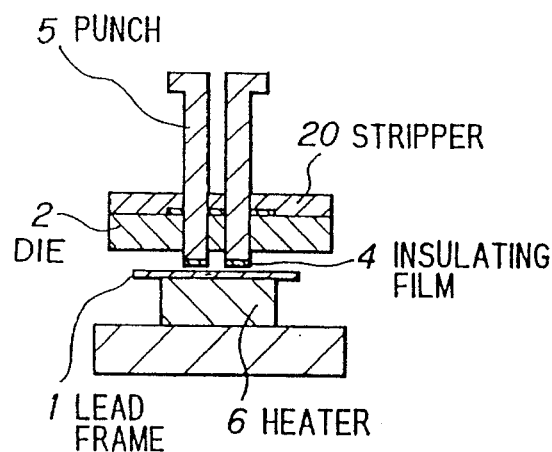

FIGS. 7A and 7B show an apparatus for fixing insulating films to a lead frame which comprises a die 2 on which an insulating film 4 is transferred to be punched, punches 5 for punching the insulating film 4 to provide two punched insulating films 4, a heater 6 for heating a lead frame 1 transferred thereon, and a stripper 20 for stripping the insulating film 4 from the upward moving punches 5.

In operation, the lead frame 1 is transferred to be heated on the heater 6. At the same time, the insulating film 4 composed of a polyimide film having an edge tearing resistance of 50 to 70 kgf/20 mm and thermoplastic or thermosetting adhesive layers on both surfaces of the polyimide film is transferred on the die 2. Then, the punches 5 are moved down to punch the insulating film 4 (FIG. 7A), and the two punched insulating films 4 are retained on tip planes of the punches 5 by vacuum, and lowered to be adhesively fixed to the lead frame 1 (FIG. 7B).

It should be noticed that an edge tearing resistance indicates a breakage strength against a compression stress in the thickness direction, while a tearing strength indicates a breakage strength against a pulling stress in the direction orthogonal to the thickness direction. For this reason, the edge tearing resistance and the tearing strength are absolutely different, especially, in regard to applied compression and tension forces.

An experiment was conducted prior to filing the present application to check for a relationship between (a) the physical characteristics of tensile strength and tearing resistance of available insulating films and (b) an occurrence rate of burrs at the time of punching the insulating films. However, the inventors did not find any specific correlation of tensile strength and tearing resistance to occurrence rate of burrs. Then, the inventors investigated the method for measuring an edge tearing resistance of an insulating film in which the breakage of the insulating film is similar to that in punching an insulating film.

Available insulating films were measured for edge tearing resistance, and a correlation as shown in FIG. 5 was confirmed. Occurrence of burrs is negligible at edge tearing resistance of 50 kgf/20 mm. and higher.

Figure 8:
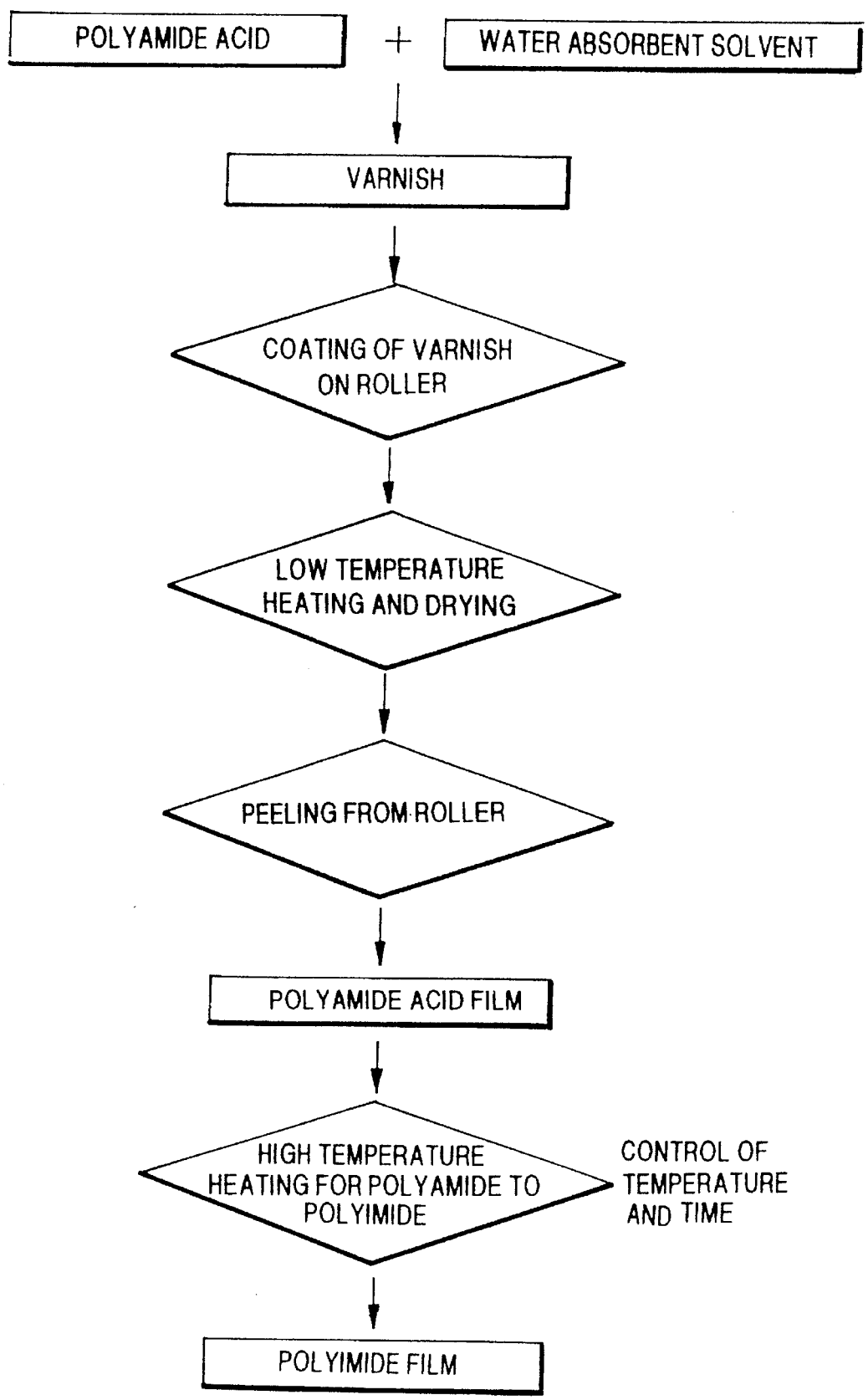
FIG. 8 is a flow chart for fabricating an insulation film for use in accordance with the invention.

FIG. 8 shows a process for fabricating an insulating film having an edge tearing resistance of 50 to 70 kgf/20 mm.

Varnish is prepared by adding hygroscopic organic solvent to polyamide acid. A rotating roller having a predetermined diameter is coated with the varnish. A varnish film (polyamide acid) on the roller is heated and dried.

Then, the varnish film is peeled from the roller to provide a polyamide acid film. With further heating, the polyamide acid film is inverted to a polyimide film. In this stage, the temperature and heating time are controlled to adjust the content of the hygroscopic organic solvent (a residual solvent amount) contained in the polyimide film. Thus, an edge tearing resistance of the polyimide film is made to be 50 to 70 kgf/2 mm.

The inventors found that a polyimide film having a large edge tearing resistance also has high flexibility. It is considered that, when a great amount of water is contained in a polymer precursor, water is included among molecules constituting the polymer. When the water is evaporated, fine voids are generated among the molecules and provide the high flexibility.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. An insulating film with improved punching characteristics, comprising:

a polyimide insulating base film having an edge tearing resistance in a range of 50 to 70 kgf/20 mm; and one of insulating thermoplastic and insulating thermosetting adhesive layers provided on at least one surface of said insulating base film.

2. A lead frame using an insulating film with improved punching characteristics, comprising:

inner lead portions to be connected to a semiconductor chip;

outer lead portions to be connected to external circuits; and polyimide insulating films punched to a predetermined configuration, said punched films being adhesively fixed to said inner lead portions;

wherein said punched films have an edge tearing resistance in a range of 50 to 70 kgf/20 mm.

3. A lead frame using an insulating film with improved punching characteristics, according to claim 2, wherein:

each of said insulating base films is coated on at least one surface with one of a thermoplastic and thermosetting adhesive layer.

* * * * *